July 30, 1957 E. KEONJIAN ET AL 2,801,340

SEMICONDUCTOR WAVE GENERATOR

Filed June 3, 1955 2 Sheets-Sheet 1

INVENTORS:
EDWARD KEONJIAN,
JEROME J. SURAN,

BY George V. Eltgroth
THEIR ATTORNEY.

July 30, 1957 E. KEONJIAN ET AL 2,801,340
SEMICONDUCTOR WAVE GENERATOR
Filed June 3, 1955 2 Sheets-Sheet 2

INVENTORS:
EDWARD KEONJIAN,
JEROME J. SURAN,
BY George V. Eltgroth
THEIR ATTORNEY.

United States Patent Office 2,801,340

Patented July 30, 1957

2,801,340

SEMICONDUCTOR WAVE GENERATOR

Edward Keonjian and Jerome J. Suran, Syracuse, N. Y., assignors to General Electric Company, a corporation of New York Application June 3, 1955, Serial No. 513,034

12 Claims. (Cl. 250—36)

This invention relates to signal generating and pulse delay networks, and more particularly to networks of this character utilizing semiconductor devices.

The increasing use of pulse circuits in such electronic systems as radar, servomechanisms, digital computers, counters, etc., has caused a growing concern over the complexity and expense of these circuits. One of the older of the pulse or digital-type circuits is the multivibrator which is a two-state circuit with an "on" and "off" condition corresponding to the two operating states of a mechanical relay. In its well-known application as an electronic switch, the multivibrator extended the use of relaying to high speed operations, such as that required in modern electronic computers. With the advent of the transistor as a low power, long life and tiny active element, these circuits have been greatly improved in reliability and reduced in size. This invention deals with a new and novel semiconductor relaxation oscillator circuit which provides another advance in circuit simplicity and allows a higher degree of miniaturization than previous multivibrators.

The semiconductor device used by this invention consists of a single rectifying junction made to a bar of semiconductor material which has in addition at least two ohmic electrodes connected at spaced points along the bar. The rectifying junction may be formed by fusing a dot of donor or acceptor material to a semiconductor bar of proper composition by techniques now well-known in the art. By this method, a P–N or N–P rectifying junction may be formed. Assuming an acceptor dot and an N-type bar, if the P-region of this junction is made positive with respect to the N-region opposite, the junction is biased in the forward direction and holes are injected into the N-type region from the P-region. With this type of bias, the P-region is acting as an emitter and the diode is biased in its easy direction of current flow. If the P-region is biased negatively with respect to the N-region, little current will flow. If a biasing potential is applied between the two ohmic electrodes, an electric field is established over the bar of semiconductor material. With the junction biased forwardly, the holes injected into the bar drift toward its negative end under the influence of the electric field. This lowers the resistivity in the end of the bar between the junction and the negative ohmic electrode and is primarily responsible for the negative resistance characteristic exhibited by the described semiconductor device. Due to this characteristic, the semiconductor device is readily adaptable for use as a relaxation oscillator or a delayed pulse generator as embodied in this invention. For further details concerning the semiconductor device utilized in this invention, reference may be made to the applications by I. A. Lesk, Serial Number 341,164, filed March 9, 1953, now Patent No. 2,769,926, issued November 6, 1956, and J. M. Engel, Serial Number 373, 828, filed August 12, 1953, which are assigned to the assignee of the present application.

It has been found that, with proper cooperating circuitry, the aforesaid semiconductor device may be utilized for performing wave generating and/or pulse delaying functions. Therefore, an object of this invention is to provide a new and improved relaxation oscillator circuit using a semiconductor device which has only a single rectifying junction.

A further object of this invention is to provide a new and improved delayed-pulse generating circuit.

Another object of the present invention is to provide a new and improved semiconductor relaxation oscillator circuit which combines simple and rugged construction with efficient operation.

Still another object of this invention is to provide a new and improved wave generating circuit which makes possible a higher degree of miniaturization and circuit simplicity.

Still another object of this invention is to provide a new and improved semiconductor wave generating circuit which allows a substantial reduction of circuit components than prior art disclosures. By reducing the number of components used, a significant cost reduction may result. This advantage will be greatly multiplied when a number of these circuits are employed in complex digital data handling systems.

These and other advantages of the invention will be more clearly understood from the following description taken in connection with the accompanying drawings and its scope will be apparent from the appended claims.

Figure 1:
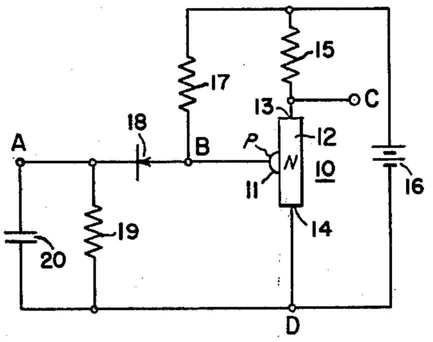
Figure 1 is a diagrammatic illustration of one embodiment of this invention.

Figure 1 utilizes the non-linear characteristic of semiconductor 10 in a relaxation oscillator circuit. Semiconductor 10 consists of a bar 12 of semiconducting material, such as N-type silicon or germanium, having ohmic electrodes 13 and 14 attached to spaced points thereon, and a rectifying junction 11 which consists of an indium dot fused to a portion of the bar 12 within a region affected by an electric field between electrodes 13 and 14. The electric field existing along the bar 12 is supplied by a source of potential 16 having one pole connected to ohmic contact 13 through a resistance 15 and the other pole directly connected to ohmic electrode 14. A resistance 17 is connected to source of potential 16 and to the rectifying junction 11 of semiconductor 10. Diode 18 is connected to rectifying junction 11 of semiconductor 10 and to a resistance 19 which is connected to ohmic electrode 14 of semiconductor 10, poled to present easy flow to currents directed away from junction 11. A capacitance 20 is connected across resistance 19. The aforesaid circuit components are all that are required by this new semiconductor relaxation oscillator. The relative simplicity of this circuit is striking when compared to prior art vacuum tube and transistor multivibrator circuits.

Having set forth the circuit configuration of Figure 1, its operation can now be considered. Assuming initially that the semiconductor 10 is biased in the cut-off region of its operating characteristic (see Figure 2), capacitor 20 charges from source of potential 16 through resistance 17 and diode 18. During the charging cycle of capacitor 20, diode 18 is conducting but semiconductor 10 remains non-conducting. As the potential across capacitor 20 builds up equal to or greater than the peak point potential $V_p$ of semiconductor 10 (shown in Figure 2), the latter becomes unstable and enters into its conducting state. When semiconductor 10 begins conducting, the potential at junction 11 drops to a relatively low value. Since the potential across capacitor 20 is greater than the potential of rectifying junction 11, diode 18 is cut off. Since diode 18 is in its non-conducting state, capacitor 20 is now isolated from semiconductor device 10, and thus discharges through resistance 19 until its potential is reduced to approximately equal the junction potential of semiconductor device 10. This biases diode 18 forwardly which causes it to become conducting again. This reverses the current flow through junction 11 of semiconductor 10, which is then driven into its cut-off state once more. The cycle becomes repetitive as capacitor 20 recharges to the peak point potential.

Figure 3A:
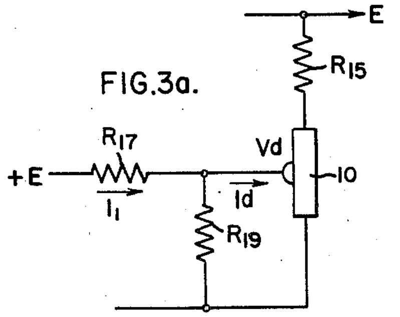
Figure 3 shows the steady-state equivalent circuits of Figure 1.

A better understanding of the operation of the semiconductor relaxation oscillator circuit of Figure 1 may be obtained by considering its "steady-state" equivalent circuits shown in Figure 3. Capacitor 20 is omitted from the equivalent circuits, and diode 18 is assumed to have negligible forward resistance and an infinite back resistance. Writing the loop equation for the circuit of Figure 3(*a*) in which diode 18 is conducting gives:

$$E=(R_{19}+R_{17})I_1-R_{19}I_d \qquad (1)$$

$$O=-R_{19}I_1+R_{19}I_d+V_d \qquad (2)$$

where $V_d$=junction voltage
$I_d$=junction current
$E$=applied voltage
$I_1$=current through resistances 17 and 19
$R_{17}$=resistance 17
$R_{19}$=resistance 19

Solving Equations 1 and 2 for $V_d$ as a function of $I_d$ provides:

$$V_d=\frac{R_{19}}{R_{19}+R_{17}}E-\frac{R_{19}R_{17}}{R_{19}+R_{17}}I_d \qquad (3)$$

Figure 3B:
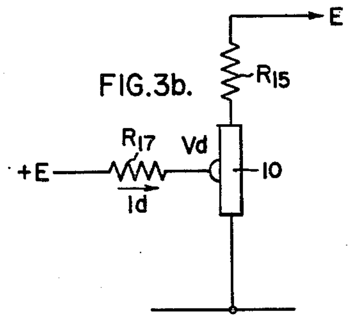

Figure 3*b* represents the steady-state equivalent circuit for Figure 1 when diode 18 is non-conducting. Assuming that resistance 19 is effectively isolated from semiconductor 10 by the large back resistance of diode 18

$$V_d=E-R_{17}I_d \qquad (4)$$

The application of Equations 3 and 4 to the operating characteristics of semiconductor 10 (shown in Figure 2) permits a graphical load-line analysis similar to that used in vacuum tube circuit design. For the condition that diode 18 conducts, the steady-state input load line is determined by Equation 3 and is represented by the dashed line in Figure 2. The intersection of the load line with the ordinate axis ($I_d$=0) is at a point $$V_d=\frac{R_{19}E}{R_{19}+R_{17}}$$

and the absolute slope of the load line is the parallel combination of resistances 17 and 19. For the condition that diode 18 is non-conducting, the load-line characteristic is determined by Equation 4 and is represented by the solid line in Figure 2 with absolute slope equal to resistance 17.

In order for the relaxation oscillator of Figure 1 to be free-running, the input load line must not intersect the junction input characteristic of semiconductor 10 at a stable operating point. Consequently, the following conditions must exist:

(*a*) When diode 18 is conducting, the input load line should not intersect the operating characteristic of semiconductor 10 in the cut-off region which means $$\frac{R_{19}E}{R_{19}+R_{17}}>V_p$$

(*b*) When diode 18 is non-conducting, the input load must intersect the operating characteristic of semiconductor 10 in the transition, or negative resistance region which means $$\frac{E}{R_{17}}<I_v$$

where $I_v$=input current associated with the valley point of the operating characteristic of semiconductor 10.

Figure 2:
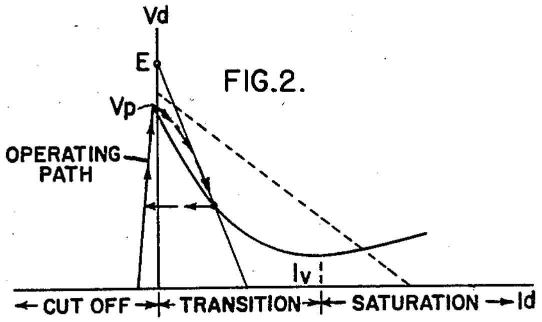
Figure 2 shows the operating characteristic of the semiconducting device utilized in this invention.

The operating path of the relaxation oscillator, in relation to input characteristic of semiconductor 10, is approximately indicated by the aforesaid graphic analysis in Figure 2. As will appear obvious, the frequency and symmetry of the generated wave form is dependent upon the time constants associated with resistance 17, resistance 19 and capacitance 20.

Figure 4:
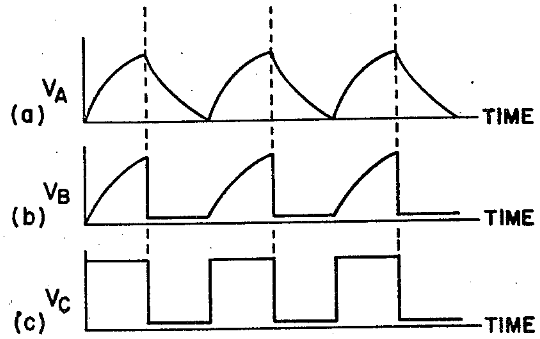
Figure 4 shows the wave forms produced by the circuit shown in Figure 1 at specified points therein.

The waveforms generated by the relaxation oscillator circuit of Figure 1 are illustrated in Figure 4. The waveform at point A (see Figure 4(*a*)) consists of a periodic exponential rise and decay, since capacitor 20 alternately charges and discharges through fixed resistances 17 and 19, respectively. During the time the diode 18 is conducting, the waveform at point B in Figure 1 is almost identical to that at point A. However, when semiconductor 10 begins conducting, the potential at point B drops sharply and remains relatively small until capacitor 20 has completed its discharge cycle, thus providing the waveform illustrated in Figure 4(*b*). When semiconductor 10 is in its cut-off state, the current through resistance 15 will be comparatively small. However, when semiconductor 10 conducts, the resistance of bar 12 drops by an order of magnitude and the current through resistance 15 increases substantially. Consequently, the current through resistance 15 will be either high or low, depending upon the operating state of semiconductor 10. This produces at point C the rectangular wave illustrated in Figure 4(*c*). As previously stated, the frequency and symmetry of these generated waveforms is dependent on the time constants associated with resistance 19, resistance 17 and capacitor 20.

Figure 5:
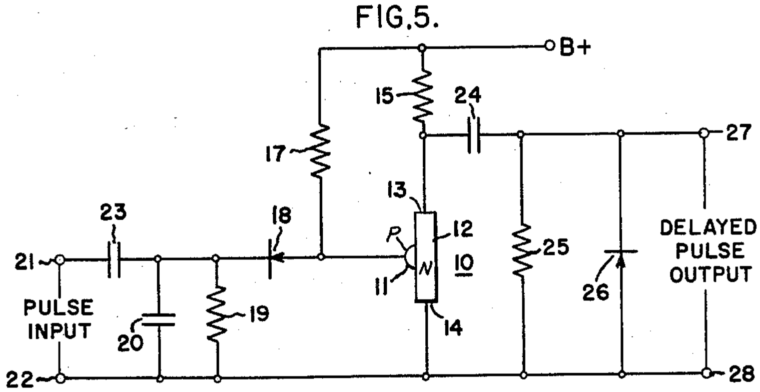
Figure 5 is a diagrammatic illustration of another embodiment of this invention.

By way of example only, assuming a 10 kc. signal is desired from the circuit with an operating source of 12 volts, the following circuit parameters would be set as follows:

$R_{17}$=12,000 ohms
$R_{15}$=3,500 ohms
$R_{19}$=18,600 ohms
$C_{20}$=.0015 microfarad Figure 5 shows the multivibrator of Figure 1 used as a monostable circuit to perform a pulse delaying function. The monostable relaxation network schematically shown in Figure 5 is triggered either "on" or "off," depending upon its initial state of stable operation, by an external signal. After a given time interval, it returns to its initial stable state independently of the trigger signal. A pulse signal input may be applied to circuit terminals 21 and 22. A capacitor 23 couples the input signal to the monostable network which is composed of circuit components similar to those shown in Figure 1 and designated by the same reference numerals. Additionally, the circuit contains a differentiating circuit comprising a serially connected capacitance 24 and resistance 25, and a diode 26. Capacitor 24 is connected to ohmic electrode 13 of semiconductor 10 and to resistance 25 which is connected to ohmic electrode 14. Diode 26 is connected across resistance 25, and output terminals 27 and 28 are provided across diode 26.

The network shown in Figure 5 may be made monostable if:

$$\frac{R_{19}E}{R_{19}+R_{17}}<V_p \qquad (5)$$

and $$E/R_{17}<I_v \qquad (6)$$

Equation 5 fixes the stable operating point of semiconductor 10 in its cut-off region, and Equation 6 insures that this is the only stable operating point. Provided that the Equations 5 and 6 are satisfied, a positive pulse applied at input terminals 20 and 21, and coupled to the multivibrator by capacitance 23, triggers the semiconductor 10 from the "off" state to the "on" state. This is caused by the increase in potential across capacitor 20 by the applied input pulse which biases semiconductor 10 into its conducting region, as has been explained with respect to Figure 1. Semiconductor 10 remains conductive until capacitor 20 discharges through resistance 19. When the current flow through diode 18 reverses at the end of the capacitor 20 discharge cycle, semiconductor 10 becomes non-conductive. Since the quiescent operating point of semiconductor 10 is fixed in the cut-off region, the relaxation network remains stable until the next positive trigger pulse is applied to input terminals 21 and 22. Consequently, after a given time interval, the multivibrator circuit returns to its initial stable state independently of the trigger signal. The repetition rate of the generated waveform depends upon the frequency of the trigger signal, but the duration of the "on" or "off" state is determined by the circuit constants.

Figure 6:
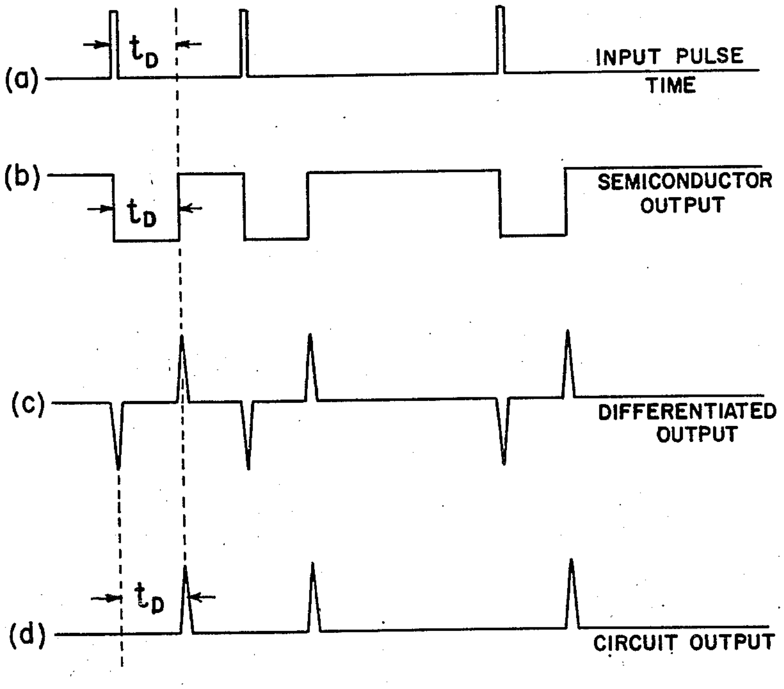
Figure 6 shows the wave forms obtained at specified points in the circuit shown in Figure 5.

Figure 6 shows the waveforms associated with the circuit of Figure 5. Figure 6(*a*) shows a positive input pulse which is applied to the input terminals 21 and 22 of the multivibrator circuit. The output of semiconductor 10 taken across ohmic electrodes 13 and 14 is shown in Figure 6(*b*). Figure 6(*b*) indicates that semiconductor 10 is triggered on by the input pulses shown in Figure 6(*a*) and remains on for a period determined by the circuit constants. The output of the semiconductor 10 is applied to the differentiating circuit comprising the serially connected capacitor 24 and resistance 25, the output of which is shown in Figure 6(*d*). This output waveform consists of pulses which are generated by differentiating the trailing edge of the multivibrator output. Diode 26 which is connected across the differentiating circuit dissipates the negative going pulses which are generated by the leading edge of the multivibrator waveform. Without the diode 26 in the circuit, the output waveform would consist of a train of pulses of alternating polarity as illustrated in Figure 6(*c*). Consequently, the output of the delayed pulse generator, as shown in Figure 5, consists of a train of pulses which have the same polarity and repetition rate as the input pulses, but which are delayed in time by an interval $t_0$ determined by the time constants of the monostable multivibrator circuit.

A stable operating point associated with the conductive state of semiconductor 10 may be obtained by specifying the following circuit conditions:

$$\frac{R_{19}E}{R_{19}+R_{17}}>V_p \qquad (7)$$

$$E/R_{17}>I_v \qquad (8)$$

Under these conditions, the operating point of semiconductor 10 being set in a saturating region, negative pulses may then be used to trigger the circuit into its regenerative cycle to produce the delayed pulse output. Although semiconductor device 10 is shown and described having a P–N junction, it will appear obvious to those skilled in the art that a N–P junction may be used by reversing the polarities of the biasing potentials.

The semiconductor relaxation network embodied in this invention consists of only two directly active resistances, a resistance serving as an output load, one capacitor, one diode and one single junction semiconducting device. When compared to corresponding vacuum tube and transistor multivibrator circuits, this configuration affords an almost two to one economy in circuit components. Furthermore, since the relaxation network shown and described in this invention consists of one diode and one single junction semiconducting device, it is more economical than prior art disclosures which use two transistors in a multivibrator circuit. This invention offers circuit simplicity, ready control of design parameters, and component economy. These advantages may be particularly significant in such complex electronics systems as digital computers and counters where component costs and network complexity are major considerations. Since other modifications varied to fit particular operating requirements and environments will be apparent to those skilled in the art, the invention is not considered limited to the examples chosen for examples of disclosures and covers all changes and modifications which do not constitute departures from the true spirit and scope of this invention.

What we claim as new and desire to secure by Letters Patent of the United States is:

1. In a circuit, the combination of a semiconducting body having at least two spaced ohmic electrodes and a rectifying junction associated therewith in a region affected by an electric potential existing between said ohmic electrodes, a first resistance, means connecting said first resistance to the electric potential and said rectifying junction, a unilateral conducting device, a second resistance, means connecting said unilateral conducting device to said rectifying junction and to said second resistance, means connecting said second resistance to the other of said ohmic electrodes, a capacitance and means connecting said capacitance across said second resistance.

2. In combination, a body of semiconductor material of one type having first and second ohmic electrodes at spaced points thereon, and a region of opposite conductivity type intermediate said ohmic electrodes forming a semiconductor junction with said body, means for applying a biasing potential to said body connected between said ohmic electrodes, a first resistance, means connecting said resistance between the electric potential and said semiconductor junction, a diode, a second resistance, means connecting said diode between said semiconductor junction and said second resistance, means connecting said second resistance to said second ohmic electrodes, and a capacitance connected across said second resistance.

3. In combination, a body of semiconductor material of one type having first and second ohmic electrodes at spaced points thereon, and a region of opposite conductivity type intermediate said ohmic electrodes forming a semiconductor junction with said body, a resistance, a source of potential, means connecting said resistance to said first electrode and to said source of potential, means connecting said source to said second electrode, a second resistance, means connecting said resistance between said source of potential and said semiconductor junction, a diode, a third resistance, means connecting said diode between said semiconductor junction and said third resistance, means connecting said third resistance to said second ohmic electrode, a capacitance connected across said second resistance, a means associated with said electrodes for utilizing the substantially square wave voltage generated by the circuit.

4. In a multivibrator circuit comprising a semiconductor device having a negative resistance characteristic, said device being composed of a bar of semiconductor material having a single rectifying junction made thereto and having at least two electrodes at spaced points thereon relative to said junction, means for applying a source of potential to said electrodes to provide a transverse electric field along said bar between said electrodes, a unilateral conducting device connected to said rectifying junction, a capacitance, means connecting said capacitance to said unilateral conducting device, means for biasing said semiconductor device into its negative resistance region, means for charging said capacitance through said unilateral conducting device while said semiconductor device is nonconducting, means for discharging said capacitance while said semiconducting device is operating whereby said discharge means is electrically isolated from said semiconductor device as said capacitor discharges by said unilateral conducting device.

5. In a multivibrator circuit comprising a semiconductor device having a negative resistance characteristic, said device being composed of a bar of semiconductor material having a single rectifying junction made thereto and having at least two electrodes at spaced points thereon relative to said junction, means for applying a source of potential to said electrodes to provide a transverse electric field along said bar between said electrodes, a unilateral conducting device connected to said rectifying junction, a capacitance, means connecting said capacitance to said unilateral conducting device, means for biasing said semiconductor device into its negative resistance region, means for charging said capacitance through said unilateral conducting device while said semiconductor device is nonconducting, means for discharging said capacitance while said semiconducting device is operating, whereby the charging and discharging of said condenser coincides with the non-conducting and conducting states, respectively, of said semiconductor device, and means associated with said multivibrator circuit for utilizing the square wave signal generated thereby.

6. In a circuit, the combination of a semiconducting body having at least two spaced ohmic electrodes and a rectifying junction associated therewith in a region affected by an electric potential existing between said ohmic electrodes, a first resistance, means connecting said first resistance between one of said ohmic electrodes and said rectifying junction, a unilateral conducting device, a second resistance, means connecting said unilateral conducting device to said rectifying junction and to said second resistance, means connecting said second resistance to the other of said ohmic electrodes, a capacitance, means connecting said capacitance across said second resistance, means for applying input pulse signals to said circuit, and means associated with said circuit for deriving the delayed output pulse signals therefrom.

7. In combination, a body of semiconductor material of one type having first and second ohmic electrodes at spaced points thereon, and a region of opposite conductivity type intermediate said ohmic electrodes forming a semiconductor junction with said body, means for applying a biasing potential to said body connected between said ohmic electrodes, a first resistance, means connecting said resistance between said first ohmic electrode and said semiconductor junction, a diode, a second resistance, means connecting said diode between said semiconductor junction and said second resistance, means connecting said second resistance to said second ohmic electrodes, a capacitance connected across said second resistance, means for coupling an input pulse signal to said capacitance, a differentiating circuit, means connecting said differentiating circuit across said first and second ohmic electrodes, a rectifying device connected to said differentiating circuit and means connected to said rectifying device for utilizing the delay pulse signal generated by the circuit network.

8. In combination, a body of semiconductor material of one type having first and second ohmic electrodes at spaced points thereon, and a region of opposite conductivity type intermediate said ohmic electrodes forming a semiconductor junction with said body, a load resistance, a source of potential, means serially connecting said load resistance and said source of potential between said ohmic electrodes, a second resistance, means connecting said resistance between said first ohmic electrode and said semiconductor junction, a diode, a third resistance, means connecting said diode between said semiconductor junction and said third resistance, means connecting said third resistance to said second ohmic electrode, a capacitance connected across said second resistance, means for coupling an input pulse signal to said capacitance, a serially connected resistance and capacitance, means connecting said serially connected resistance and capacitance across said first and second ohmic electrodes, a diode connected across said serially connected resistance and capacitance, and means connected across said diode for utilizing the delayed pulse signal derived therefrom.

9. In a circuit, a semiconductor device having a negative resistance characteristic comprising semiconducting body having at least two spaced ohmic electrodes and a rectifying junction associated therewith in a region affected by an electric potential existing between said ohmic electrodes, means for biasing said device for monostable operation, a parallel network comprising a resistance and a capacitance, a diode, means coupling said parallel circuit through said diode to said rectifying junction, means for charging said capacitance through said diode, means for applying signal input pulses to said parallel network whereby said pulses trigger said semiconductor device, a differentiating circuit connected across said ohmic electrodes, a diode connected across said differentiating circuit, and means associated with said diode for utilizing the delayed pulse signals generated by said circuit.

10. In a circuit, a negative resistance device, a resistance-capacitance network, means for charging the resistance-capacitance network while said negative resistance device is non-conductive, means whereby said negative resistance device becomes conductive as said resistance-capacitance network discharges, and means for effectively electrically isolating said negative resistance device from said resistance-capacitance network while the latter is discharging.

11. In a circuit, a semiconductor device having a negative resistance characteristic, a unilateral conducting device, a resistance-capacitance network, means connecting said unilateral conducting device between said semiconductor device and said resistance-capacitance network, means for charging said resistance-capacitance whereby said semiconductor is non-conductive, and means whereby said semiconductor device conducts as said resistance-capacitance network discharges.

12. In a circuit, a semiconducting device having a negative resistance characteristic, a diode, an R-C network, means connecting said diode between said semiconducting device and said R-C network, means for charging said R-C network through said diode whereby said semiconducting device is nonconductive during the charging cycle of said R-C network, means whereby said semiconducting device becomes conductive and said diode electrically isolates the said R-C network from said semiconducting device during its discharge cycle which occurs during the conducting cycle of said semiconductor device.

References Cited in the file of this patent

RCA Review for March 1949, pages 14–16.

"Principles of Transistor Circuits," R. F. Shea et al., John Wiley and Sons Inc., New York, pages 466–471, 1953.

"Negative Resistance in Germanium Diodes," by Kauhe, pp. 8–10 of "Radio Electronic Engineering" for April 1953.

"Transistor Flip-Flop Uses Two Frequencies," by Brock, "Electronics" for June 1954, pp. 175–177.